United States Patent [19]
Sohlbarand

[11] 3,723,178
[45] Mar. 27, 1973

[54] PROCESS FOR PRODUCING CONTACT METAL LAYERS CONSISTING OF CHROMIUM OR MOLYBDENUM ON SEMICONDUCTOR COMPONENTS

[75] Inventor: Heinrich Sohlbarand, Munich, Germany

[73] Assignee: Siemens Aktiengesellschaft, Berlin and Munich, Germany

[22] Filed: Mar. 11, 1971

[21] Appl. No.: 123,174

[30] Foreign Application Priority Data

Mar. 13, 1970 Germany....................P 20 12 031.4

[52] U.S. Cl. ..........117/227, 117/46 CA, 117/160 R, 117/212

[51] Int. Cl.............................................H01l 1/14

[58] Field of Search.......117/212, 217, 160 R, 46 CA

[56] References Cited

UNITED STATES PATENTS

| | | | |
|---|---|---|---|
| 3,515,583 | 6/1970 | Inoue et al. | 117/107.2 R |
| 3,477,872 | 11/1969 | Amick | 117/212 |
| 3,434,871 | 3/1969 | Hauel et al. | 117/119 |

*Primary Examiner*—Ralph S. Kendall
*Attorney*—Curt M. Avery, Arthur E. Wilfond, Herbert L. Lerner and Daniel J. Tick

[57] ABSTRACT

The invention relates to a method of producing contact metal layers consisting of chromium or molybdenum on semiconductor components. A varnish solution containing the metal compound is applied to the surface of the substrate wafer and converted into the pure metal layer through thermolysis of the varnish containing the metal compound. The invention is particularly well suited for the production of chromium or molybdenum layers on semiconductor crystal surfaces.

9 Claims, 3 Drawing Figures

PROCESS FOR PRODUCING CONTACT METAL LAYERS CONSISTING OF CHROMIUM OR MOLYBDENUM ON SEMICONDUCTOR COMPONENTS

My invention relates to a method for producing a fast adhering, contactable metallization on surfaces of electric circuit components such as silicon planar sem conductor components which comprises the steps of applying a solution containing the metal or a liquid suspension upon the surface to be metallized, evaporating the liquid and converting the remaining layer which contains the metal compound, into a pure metal layer by heating and subsequently sintering or alloying the layer into the semiconductor surface.

One of the last production steps in a system for producing electrical components, more particularly microsemiconductor components, according to the planar or the mesa techniques, is the defined application of emitter or base contacts or conductor paths. This is so effected that a wafer of semiconductor material, e.g., a silicon monocrystal wafer, provided with a plurality of component systems, has the systems thereon completed by vapor deposition using appropriate masks or stencils, with the desired metal, e.g., aluminum or its alloys, silver, gold, platinum, chromium or molybdenum and is thereafter divided into individual components.

If, due to the small geometries, vapor deposition by means of a mask is no longer possible, the metal layer is applied over the whole area and an appropriate photo resist or varnish is applied. The desired structure is produced by exposing and developing the photo varnish after which the metal layer is peeled off from the undesired localities of the semiconductor system. In addition to metal vapor depositing, it is also possible to apply the metallization of a semiconductor surface by cathode sputtering or with the aid of a galvanic solution. These methods require a considerable expenditure in equipment and furthermore have the disadvantage that the metallizations thus produced are not excellent with respect to their adhesiveness and their layer thickness on the semiconductor surface, thus making the contactability more difficult. This results in mechanical and electrical breakdowns in the thus produced semiconductor circuit components.

It is an object of the present invention to improve the adhesiveness and thus of the contactability of metallizations comprising aluminum alloys on semiconductor surfaces and at the same time to provide a method which works rationally and does not entail a great deal of apparatus.

I produce a metallization consisting of chromium or molybdenum by applying a solution of the respective metal diacetyldihydrazontetracarbonyl compound, dissolved in an organic varnish which is converted through thermal dissociation, (thermolysis) in an oxygen/argon atmosphere at temperatures between 250° and 400° C, into a pure chromium or molybdenum layer and alloyed into the semiconductor surface.

It is within the frame work of the invention to use as the varnish solution a photo sensitive varnish commonly called photo resist. It is equally possible, however, to use nitrocellulose, dissolved in butylacetate/ether. The use of organic varnishes can provide particularly uniform coating thicknesses, over the entire semiconductor surface to be coated. This results, accordingly, in uniform metal layers. When photo resists are used, the known method steps of photo technology and a subsequent heating will make it possible to produce very finely detailed metal structures, down to widths of one one-thousandth mm. The method of the invention may be very favorably utilized for producing chromium and molybdenum contacts on free semiconductor crystal surfaces, which are coated with masking or protective layers ($SiO_2$, $Al_2O_3$, $Si_3N_4$). It may also be used in the presence of photo resist coatings. The chromium and molybdenum layers produced according to this method, are particularly suited due to their uniform layer thickness and due to their good electrical conductivity, for the production of semiconductor structural components, most particularly in planar technology.

For further elucidation of the invention as illustrated by an embodiment, reference shall be made to FIGS. 1 to 3, wherein.

Figure 1:
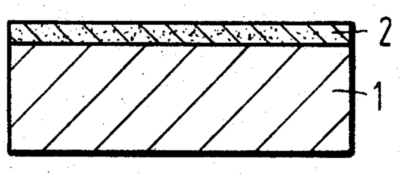
FIG. 1 shows a semiconductor substrate coated with a varnish solution containing the metal compound.
Figure 2:
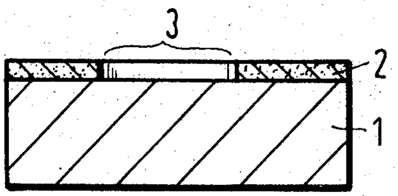
FIG. 2 shows the device after the photo method was used.
Figure 3:
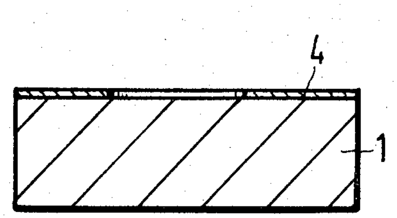
FIG. 3 shows the device after thermolysis was effected.

A substrate wafer 1 consisting of a silicon semiconductor body, as shown in FIG. 1, is sprayed for the purpose of producing a chromium layer, with a varnish consisting of nitrocellulose in butylacetate ether varnish, containing dissolved diacetyldihydrazonchromium-tetracarbonyl in a concentration of 5 – 10 percent and centrifuged on a centrifuge (15 seconds at 200 UpM). This produces the varnish film indicated as 2, at a layer thickness of 5 $\mu$m. After the varnish film is tempered at 100° C, for a maximum of 5 minutes, the substrate surface is freed in region 3 by the method steps of the photo etching technique. During the development of the photo varnish the lower lying metal layer is removed also, as shown in FIG. 2. This method step may be simplified by using, initially, a photo sensitive varnish or resist in the absence of day-light instead of the nitrocellulose varnish.

The thermolysiS or thermal dissociation of the chromium containing varnish layer is effected at 250° to 400° C in an oxygen and argon containing atmosphere and lasts for about 3 to 10 minutes. The desired chromium layer 4 then occurs on the substrate 1. A molybdenum layer may be produced analogous by using diacetyldihydrazonmolybdenumtetracarbonyl in lieu of the chromium compound.

The sintering or alloying of the chromium or the molybdenum layers into the semiconductor body is effected in the known tubular or continuous furnaces, at temperatures of 450° to 700° C.

The method according to the teaching of the present invention produces reproducible metal layer thicknesses between 400 and 2,000 A., for example, for conductor paths or for beam lead technology.

I claim:

1. The method of producing a contactable adhesion layer on surfaces of silicon planar and other semiconductor components, which comprises covering a semiconductor body with a solution in an organic varnish of a diacetyldihydrazonetetracarbonyl compound of metal from the group consisting of chromium and molybdenum, heating the solution on said semiconductor surface in an oxygen argon atmosphere at temperatures between 250° and 400° C to convert the solution into a pure coating of said metal, and alloying the metal into the semiconductor surface thereby obtaining said contactable adhesion layer.

2. The method according to claim 1, wherein said solvent varnish is photo sensitive varnish.

3. The method according to claim 1, wherein said varnish is a solution of nitrocellulose dissolved in a butylacetate/ether mixture.

4. The method according to claim 1, wherein said varnish is nitrocellulose/ether/butylacetate which contains dissolved diacetyldihydrazone-chromium-tetracarbonyl in a concentration of 5 to 10 percent.

5. The method of claim 3, wherein after applying a layer of said metal compound dissolved in nitrocellulose varnish to said semiconductor, a photosensitive varnish is deposited on top of said nitrocellulose varnish layer to permit further fabrication by photoresist technique.

6. The method of claim 1, wherein the concentration of said metal compound in said solution is adjusted to 5 to 10 percent.

7. The method of claim 1, wherein said metal containing varnish is deposited in a layer thickness of about 5 $\mu$m.

8. The method of claim 1, wherein said semiconductor body has an oxide coat upon which said metal containing varnish is deposited.

9. The method of claim 1, wherein said semiconductor body consists of silicon and has a silicon dioxide surface upon which said metal containing varnish is deposited.

* * * * *